United States Patent
Asryan et al.

(10) Patent No.: US 6,870,178 B2
(45) Date of Patent: Mar. 22, 2005

(54) SEMICONDUCTOR LASER WITH REDUCED TEMPERATURE SENSITIVITY

(76) Inventors: Levon V. Asryan, 30 Emily Dr., Centereach, NY (US) 11720; Serge Luryi, 16 Holly La., Setauket, NY (US) 11733

( * ) Notice: Subject to any disclaimer, the term of this patent is extended or adjusted under 35 U.S.C. 154(b) by 0 days.

(21) Appl. No.: 10/468,387

(22) PCT Filed: Feb. 28, 2002

(86) PCT No.: PCT/US02/06382

§ 371 (c)(1),
(2), (4) Date: Feb. 17, 2004

(87) PCT Pub. No.: WO02/082602

PCT Pub. Date: Oct. 17, 2002

(65) Prior Publication Data

US 2004/0129931 A1 Jul. 8, 2004

Related U.S. Application Data

(60) Provisional application No. 60/272,202, filed on Feb. 28, 2001.

(51) Int. Cl.[7] .............................. H01L 29/06; H01S 5/00

(52) U.S. Cl. ........................... 257/14; 257/23; 257/431; 257/97; 372/43

(58) Field of Search ................................ 257/9, 14, 21, 257/23, 25, 431, 97; 372/43

(56) References Cited

U.S. PATENT DOCUMENTS

| 5,416,338 A | 5/1995 | Suzuki et al. .................. 257/21 |
| 2004/0129931 A1 * | 7/2004 | Asryan et al. ................ 257/14 |

OTHER PUBLICATIONS

Yasuhiko Arakawa (1994) "Fabrication of quantum wires and dots by mocvd selective growth", Solid–State Electronics, Elsevier Science Publishers: pps. 523–528, Apr. 1994.
Asryan et al. (1997) "Charge Neutrality Violation in Quantum_Dot Lasers", IEEE 3: pps. 148–157, Apr. 1997.
Huang et al. (2000) "Very Low Threshold Current Density Room Temperature Continuous–Wave Lasing from a Single–Layer InAs Quantum–Dot Laser", IEEE 12: pps. 227–229, Mar. 2000.
Liu et al. (2000) "The Influence of Quantum–Well Composition on the Performance of Quantum Dot Lasers Using InAs/InGaAs Dots–in–a–Well (DWELL) Structures", IEEE 36: pps. 1272–1279, Nov. 2000.

* cited by examiner

Primary Examiner—Mark V. Prenty
(74) Attorney, Agent, or Firm—Baker Botts LLP

(57) ABSTRACT

A quantum dot (QD) laser having greatly reduced temperature sensitivity employs resonant tunnel-injection of carriers into the QDs from a pair of quantum wells (QWs). The carriers are injected through barrier layers. Because the tunnel-injection process is essentially temperature-independent, and because the tunnel-injection of carriers is the dominant source of current through the device, temperature-dependent currents are virtually eliminated, resulting in a device having a temperature-independent threshold current. In an additional device, carriers are injected into QDs from a pair of optical confinement layers (OCLs), either by tunnelling or thermionic emission. Each barrier layer is designed to have a low barrier height for carriers entering the QDs, and a high barrier height for carriers exiting the QDs. As a result, parasitic current from carriers leaving the QDs is greatly reduced, which enables the device to have low temperature sensitivity even without using resonant tunnel-injection and/or QWs.

25 Claims, 9 Drawing Sheets

SEMICONDUCTOR LASER WITH REDUCED TEMPERATURE SENSITIVITY

CROSS-REFERENCE TO RELATED APPLICATION

This application claims priority to U.S. Provisional Patent Application Ser. No. 60/272,202, entitled "Temperature-Insensitive Semiconductor Laser," filed on Feb. 28, 2001, which is incorporated herein by reference in its entirety. This application is a national phase application of international application, PCT/US02/06382, filed Feb. 28, 2002.

STATEMENT REGARDING FEDERALLY SPONSORED RESEARCH OR DEVELOPMENT

This invention was partially made with U.S. Government support from the Air Force Office of Scientific Research, MURI Grant No. F49620-00-1-0331. Accordingly, the U.S. Government may have certain rights in this invention.

BACKGROUND OF THE INVENTION

Semiconductor lasers are widely used in applications such as telecommunications and optical data storage. However, the threshold current of conventional laser depends upon the temperature at which the laser is operated, and this temperature dependence causes variability in the laser's optical output even if the driving current is constant. Correction of the variability of the optical output can require complicated and costly measures such as cooling systems and feedback loops. It would therefore be preferable for the threshold current of a laser to be temperature-independent. In some cases, quantum dot (QD) lasers have demonstrated temperature insensitivity superior to that of quantum well (QW) lasers. However, conventional QD lasers still exhibit significant temperature sensitivity.

The threshold current in a semiconductor laser is the lowest injection current at which lasing emission occurs. At the lasing threshold, the optical gain of the active medium becomes equal to the total losses—the total losses being equal to the sum of the mirror losses and the internal losses. A major source of temperature dependence of threshold current in QD lasers is parasitic recombination of carriers—i.e. electrons and holes—outside the QDs. Such recombination occurs primarily in the optical confinement layer (OCL) of the device. In most conventional QD lasers, the OCL is a conductive material in which the QDs are embedded. For example, FIG. illustrates a prior art structure 502 which includes n-type and p-type cladding layers 504 and 512, and an OCL 514 comprising first and second OCL portions 506 and 510. Self-organized QDs 508 are embedded between the first and second OCL portions 506 and 510. The current flowing through the device not only includes current $I_{QD}$ resulting from carriers entering the QDs 508 and recombining to generate useful photons, but also includes parasitic current resulting from recombination of carriers in the OCL 514. The amount of this parasitic current depends on the rate at which the carriers recombine in the OCL 514, which is proportional to the populations of electrons and holes in the OCL 514. As is well-known in the art, the ratio of the population of electrons in the OCL 514 to the population of electrons in the QDs 508 increases with temperature. Similarly, the ratio of the population of holes in the OCL 514 to the population of holes in the QDs 508 also increases with temperature. As a result, the component of threshold current density associated with recombination in the OCL 514 increases with temperature, thereby causing the total threshold current also to increase with temperature.

An additional source of temperature-sensitivity in QD lasers is non-uniformity of the sizes of the QDs 508. In a typical QD laser, the QDs tend to exhibit significant size variation. The QD size variation causes undesired pumping of non-lasing QDs, an effect which further contributes to the temperature-dependence of the threshold current of the device.

Yet another cause of temperature-sensitivity in QD lasers is recombination from non-lasing (typically higher-energy) carrier states in the quantum dots. If a QD has electron and hole states other than the states being used for lasing, the extra states can be populated by thermally-excited carriers, an effect which is temperature-dependent. The carriers in the extra states can recombine to generate parasitic current. This thermally activated parasitic current adds to the temperature-dependence of the threshold current of the device.

Still another source of temperature-sensitivity in QD lasers is the violation of charge neutrality in individual quantum dots. The optical gain of a QD laser is $A=K_1(F_n+F_p-1)$, where $K_1$ is a constant, $F_n$ is the probability of occupancy of the lasing electron state in a QD, and $F_p$ is the probability of occupancy of the lasing hole state in a QD. The current associated with carrier recombination in the QDs is $I_{QD}=K_2 F_n F_p$, where $K_2$ is a constant. If a QD is charge-neutral—i.e., if the number of electrons equals the number of holes—then $F_n=F_p$, and therefore, $A=K_1(2F_n-1)$ and $I_{QD}=K_2 F_n^2$. The amount of gain A required to reach the lasing threshold is independent of temperature, and therefore, the value of $F_n$ required to reach the lasing threshold is also independent of temperature. Because $I_{QD}$ is a function of $F_n$, the threshold value of $I_{QD}$ is similarly temperature-independent. However, if the above condition of charge neutrality is violated in a QD—i.e., if there are one or more extra electrons, or one or more extra holes—then $F_n$ and $F_p$ not only tend to be unequal, but as is well-known in the art, $F_n$ and $F_p$ typically vary differently from each other as functions of temperature. See L. V. Asryan and R. A. Suris, "Charge Neutrality Violation in Quantum-Dot Lasers," IEEE Journal of Selected Topics in Quantum Electronics, Vol. 3, No. 2, April 1997. As a result, although the threshold value of $A=K_1(F_n+F_p-1)$ does not depend on temperature, the threshold value of $I_{QD}=K_2 F_n F_p$ can—and in fact, typically is—temperature-dependent. Therefore, if charge neutrality is violated, the total threshold current is typically temperature-dependent. Violation of charge neutrality is the dominant cause of temperature sensitivity at low temperatures.

SUMMARY OF THE INVENTION

It is therefore an object of the present invention to provide a QD laser in which OCL recombination is reduced or eliminated, thereby providing dramatic reduction of the temperature dependence of threshold current.

It is a further object of the present invention to provide a QD laser in which the temperature sensitivity caused by QD size variation is reduced or eliminated.

It is yet another object of the present invention to provide a QD laser in which the temperature sensitivity caused by recombination of excited carriers in non-lasing states in the QDs is reduced or eliminated.

It is still a further object of the present invention to provide a QD laser in which the temperature sensitivity caused by the violation of charge neutrality in individual QDs is reduced or eliminated.

These and other objects are accomplished by the following aspects of the present invention.

In accordance with one aspect of the present invention, a semiconductor laser structure comprises first and second barrier layers, a QD layer including at least one QD, and first and second QW layers. The QD layer is between the first and second barrier layers; the first barrier layer is between the QD layer and the first QW layer; and the second barrier layer is between the QD layer and the second QW layer. The first barrier layer is sufficiently thin to enable electrons to tunnel from the first QW layer to the QD layer. The second barrier layer is sufficiently thin to enable holes to tunnel from the second QW layer to the QD layer.

In accordance with an additional aspect of the present invention, a semiconductor laser structure comprises first and second barrier layers, a QD layer including at least one QD, an n-side OCL, and a p-side OCL. The QD layer is between the first and second barrier layers; the first barrier layer is between the n-side OCL and the QD layer; and the second barrier layer is between the p-side OCL and the QD layer. The first barrier layer has an amount of transparency for electrons traveling from the n-side OCL to the QD layer, and an amount of transparency for holes traveling from the QD layer to the n-side OCL. The second barrier layer has an amount of transparency for holes traveling from the p-side OCL to the QD layer, and an amount of transparency for electrons traveling from the QD layer to the p-side OCL. The amount of transparency for electrons traveling from the n-side OCL to the QD layer is greater than the amount of transparency for electrons traveling from the QD layer to the p-side OCL. The amount of transparency for holes traveling from the p-side OCL to the QD layer is greater than the amount of transparency for holes traveling from the QD layer to the n-side OCL.

BRIEF DESCRIPTIONS OF THE DRAWINGS

Further objects, features, and advantages of the present invention will become apparent from the following detailed description taken in conjunction with the accompanying figures showing illustrative embodiments of the invention, in which.

Throughout the figures, unless otherwise stated, the same reference numerals and characters are used to denote like features, elements, components, or portions of the illustrated embodiments.

DETAILED DESCRIPTION OF THE INVENTION

Figure 1:
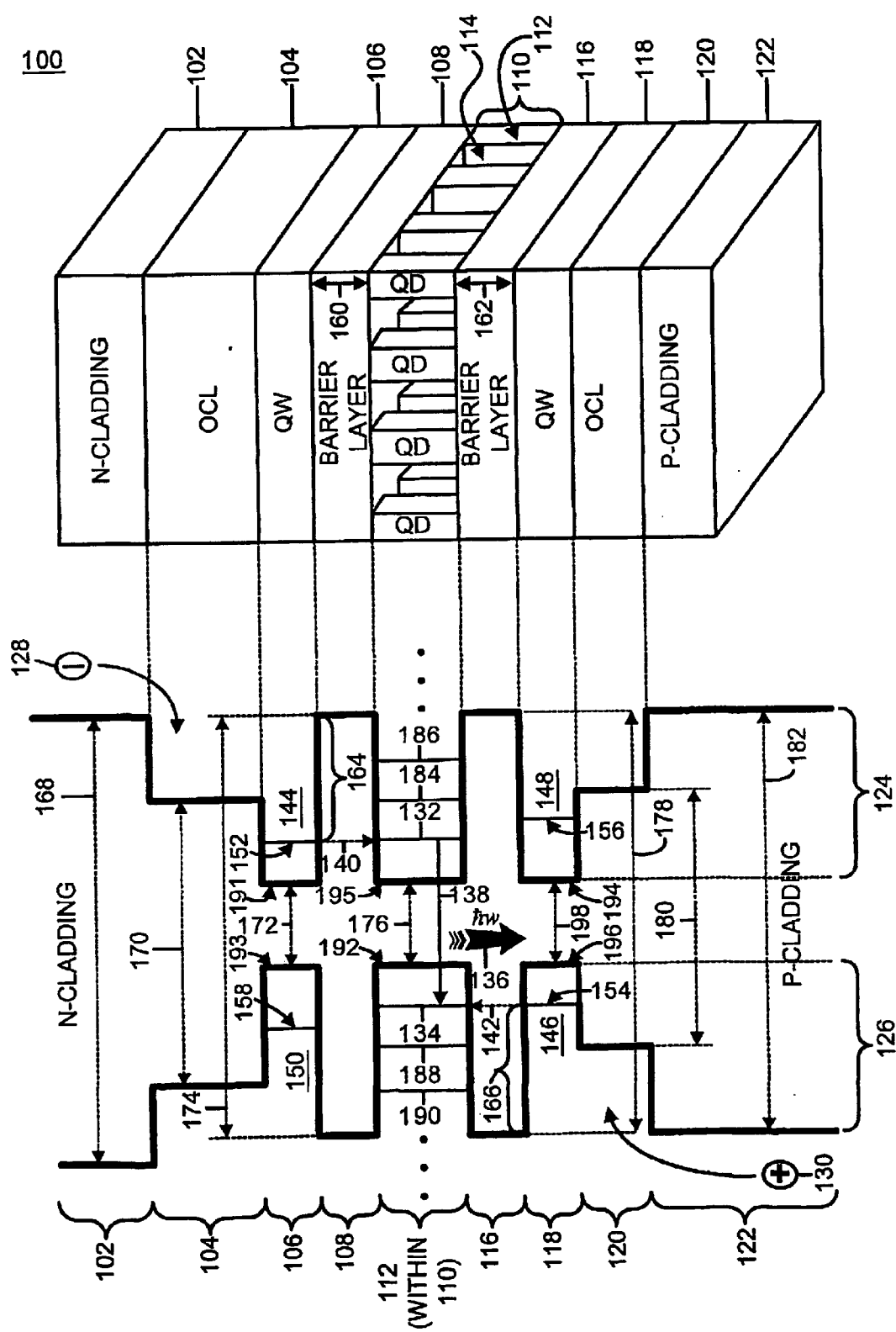
FIG. 1 is a diagram illustrating an exemplary QD laser structure, and associated valence and conduction bands, in accordance with the present invention.

FIG. 1 illustrates an exemplary QD laser structure 100 in accordance with the present invention. The structure 100 includes a QD layer 110 between a first barrier layer 108 and a second barrier layer 116. The QD layer includes one or more QDs 112 separated by a separation material 114 having a bandgap 310 (see FIGS. 3A and 3B, discussed below) which is higher than the bandgap 176 of the QDs. The structure 100 also includes n-side and p-side QW layers 106 and 118 which are separated from the QD layer 110 by the first and second barrier layers 108 and 116, respectively. The thickness 160 of the first barrier layer 108 is sufficiently small to enable electrons 128 to tunnel from the n-side QW layer 106 to the QD layer 110. Similarly, the thickness 162 of the second barrier layer 116 is sufficiently small to enable holes 130 to tunnel from the p-side QW layer 118 to the QD layer 110. The structure 100 also includes n-side and p-side OCLs 104 and 120, and n-side and p-side cladding layers 102 and 122. The n-side QW layer 106 is between the n-side OCL 104 and the first barrier layer 108. The p-side QW layer 118 is between the p-side OCL 120 and the second barrier layer 116. The n-side OCL 104 is between the n-side cladding layer 102 and the n-side QW layer 106. The p-side OCL 120 is between the p-side cladding layer 122 and the p-side QW layer 118.

FIG. 1 also illustrates the conduction band 124 and valence band 126 associated with a current path passing through one of the QDs 112 in the QD laser structure 100 described above. The band diagrams 124 and 126 are illustrated in terms of electron potential energy; accordingly, the upward direction in FIG. 1 corresponds to increasing electron energy, whereas the downward direction in FIG. 1 corresponds to increasing hole energy. As is illustrated in the drawing, the QDs 112 are formed from a material having a bandgap 176 which is lower than the bandgaps 174 and 178 of the barrier layers 108 and 116. The QW layers 106 and 118 are formed from materials having bandgaps 172 and 198 which are lower than the bandgaps 174 and 178 of the barrier layers 108 and 116, and are also lower than the bandgaps 170 and 180 of the OCLs 104 and 120. The OCLs 104 and 120 have higher indices of refraction than the respective cladding layers 102 and 122, in order to provide confinement of light generated in the QD layer 110. The bandgaps 168 and 182 of the cladding layers 102 and 122 are typically greater than the bandgaps 170 and 180 of the OCLs 104 and 120, because in most semiconductor systems used for diode lasers—e.g., InP-based systems and GaAs-based systems—the higher-bandgap materials have lower refractive indices than the lower-bandgap materials.

In bulk form, the material of the QDs 112 has a lowest electron energy level 195 and a lowest hole energy level 192. However, as will be readily understood by those skilled in the art, the quantum mechanical wave function of a carrier within a QD restricts the possible energy states of the carrier to a set of one or more discrete, quantized energy levels. For example, an electron in the QD layer 110 can exist in one of a set of quantized energy levels 132, 184, 186, etc. Similarly, a hole in the QD layer 110 can exist in one of a set of quantized energy levels 134, 188, 190, etc. The number of electron and hole energy levels in the QD layer 110 depends upon the size(s) and geometry(ies) of the QDs 112, as well as the band offsets at the heterojunction interfaces between the QDs 112 and the respective barrier layers 108 and 116. The quantized electron and hole energy levels 132, 184, 186, 134, 188, and 190 illustrated in FIG. 1 represent the energy levels occurring in a particular QD or an average-sized QD in the QD layer 110. In thermal equilibrium, an electron within the QD layer 110 has a highest probability of residing in the lowest energy level 132 (a/k/a the electron "ground state") of the QD layer 110, and a lower probability of residing in an excited (i.e., higher) state such as state 184, state 186, etc. Similarly, a hole within the QD layer 110 is highly likely to reside in the hole ground state 134, and less likely to reside in an excited state such as state 188, state 190, etc.

In bulk form, the materials of the QW layers 106 and 118 have lowest electron and hole energy levels in their conduction and valence bands. However, as will be readily understood by those skilled in the art, because the QW layers 106 and 118 are very thin, the quantum mechanical wave functions of carriers within the QW layers 106 and 118 have energies which are restricted to values higher than the lowest energy states which would exist in bulk samples of the materials. For example, the electron subband 144 of the n-side QW layer 106 has a lowest electron energy 152 which is greater than the lowest electron energy 191 of the conduction band of a bulk sample of the material from which the QW layer 106 is formed. Similarly, the hole subband 150 of the n-side QW layer 106 has a lowest hole energy 158 which is greater than the lowest hole energy 193 of the valence band of a bulk sample of the material. Likewise, the electron subband 148 of the p-side QW layer 118 has a lowest energy level 156 which is greater than the lowest energy 194 of the conduction band of a bulk sample of the material from which the QW layer 118 is formed, and the hole subband 146 of the p-side QW layer 118 has a lowest hole energy level 154 which is greater than the lowest hole energy 196 of the valence band of such a bulk sample of the material.

An electron 140 in the electron subband 144 of the aside QW layer 106 can tunnel through the first barrier layer 108 into a quantized electron energy level 132 within the QD layer 110. Preferably, the lowest electron energy level within the electron subband 144 is approximately equal to the quantized electron energy level 132 into which the electron 140 is tunneling, in order to enable resonant tunneling. Resonant tunneling not only is more efficient than non-resonant tunneling, but has other advantages which are discussed in detail below.

Similarly, a hole 142 can tunnel from the hole subband 146 of the p-side QW layer 118 into a quantized hole energy level 134 within the QD layer 110. Preferably, the lowest hole energy level 154 in the hole subband is approximately equal to the quantized hole energy level 134 within the QD layer 110, in order to enable resonant tunneling. Once electrons have tunneled into the quantized electron energy level 132 of a QD 112 in the QD layer 110, and holes have tunneled into the quantized hole energy level 134 of the QD 112, the electrons recombine with the holes—either spontaneously or by stimulation from photons already in the laser—to produce additional photons, as will be readily understood by those skilled in the art. Each recombination 138 of an electron and a hole produces an emitted photon 136.

Below and at the lasing threshold, the total injection current is the sum of the radiative recombination current $I_{QD}$ in the QDs 112 and the recombination current outside the QDs 112—i. e., the recombination current in the QW layers 106 and 118 and the OCLs 104 and 120. As is discussed above in the Background Section, the value of $I_{QD}$ required to reach the threshold condition is independent of temperature, unless the charge neutrality condition is violated in the QDs—a situation which is discussed in further detail below. On the other hand, the recombination current in the regions outside the QDs 112 is controlled by the minority carrier density in these outside regions. If tunneling through the barrier layers 108 and 116—discussed in further detail below—is the dominant mechanism by which carriers travel through the structure, then any minority carriers outside the QDs 112 are supplied primarily by the tunneling process. Yet, the rate of tunneling of electrons and holes through the barrier layers 108 and 116 does not depend on temperature. As a result, the minority carrier density outside the QDs—and the corresponding recombination current—are also independent of the temperature. Therefore, the threshold current density of the laser of the present invention is temperature-insensitive, provided that there are no other potential sources of significant, temperature-dependent, parasitic current.

In fact, in the laser structure 100 of the present invention, the only sources of parasitic current are insignificant, temperature-insensitive, or both. For example, consider the parasitic current caused by recombination of electrons which have tunneled out of the QDs 112 and through the second barrier layer 116 to become minority carriers on the p-side of the structure. The recombination of these minority electrons occurs primarily in the p-side QW layer 118 and OCL 120. Similarly, consider holes tunneling out of the QDs 112 and through the first barrier layer 108 to become minority carriers on the n side of the structure. The recombination of these minority holes occurs primarily in the n-side QW layer 106 and OCL 120. Such tunneling of carriers out of the QDs causes parasitic current. However, the number of carriers tunneling out of the QDs 112 is limited by the tunneling mechanism. Because the rate of tunneling is temperature-independent, the parasitic current caused by tunneling of carriers out of the QDs 112 is also temperature-independent. Therefore, this parasitic current does not contribute to the temperature-sensitivity of the threshold current of the laser.

On the other hand, although the tunneling of carriers out of the QDs 112 does not contribute to the temperature sensitivity of the device, it is still desirable to reduce or eliminate this parasitic current in order to reduce the threshold current and increase the efficiency of the device. Accordingly, the lowest energy 156 of the electron subband 148 in the p-side QW layer 118 is preferably designed to be greater than the lasing electron energy 132 (i.e., the energy of the electrons which are recombining with holes to generate the laser light). Similarly, in order to reduce or eliminate current caused by holes tunneling out of the QDs 112 into the n-side QW layer 106, it is preferable for the lowest hole energy 158 of the hole subband 150 in the n-side QW layer 106 to be greater than the lasing hole energy 134 (i.e., the energy of the holes which are recombining with electrons to generate the laser light).

Figure 7:
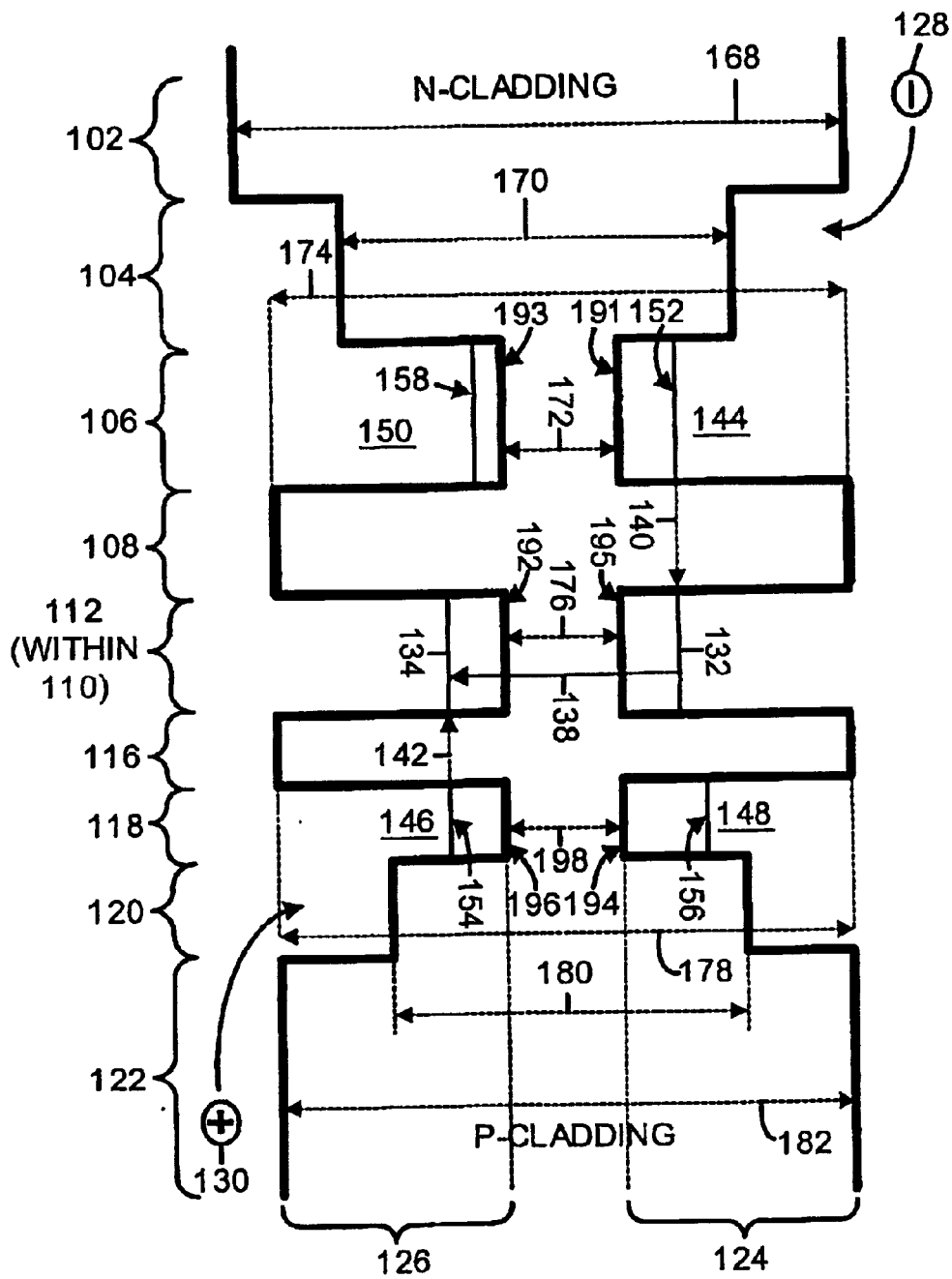
FIG. 7 is a diagram illustrating valence and conduction bands associated with an exemplary QD laser structure in accordance with the present invention.

However, it is well known that the effective mass of a hole in a given semiconductor material tends to be greater than the effective mass of an electron in that material. Accordingly, if the QDs 112 are formed from the same material as the QW layers 106 and 118, then the n-side QW layer 106 typically should be thicker than the p-side QW layer 118 in order to align the lowest edge 152 of the n-side electron subband 144 with the lasing electron energy level 132 in the QD layer 112, while also aligning the lowest edge 154 of the p-side hole subband 146 with the lasing hole energy level 134 in the QD layer 110. FIG. 7 is a band diagram of an example of such a structure. In the exemplary structure, the greater thickness of the n-side QW layer 106 causes the lowest edge 158 of the n-side hole subband 150 to be at a lower energy, not a higher energy, than the lasing hole energy level 134 in the QD layer 110. In such a structure, the above-described technique of designing the lowest hole energy 158 in the n-side QW layer 106 to be greater than the lasing hole energy 134 in the QD layer 110 may not be practicable. Therefore, in a structure in which the QDs 112 and the QW layers 106 and 118 are formed from the same material, it is preferable to use an n-side barrier layer 108 which is substantially thicker than the p-side barrier layer 116, in order to reduce the rate of tunneling of holes out of the QDs 112 into the n-side QW layer of 106. A thicker n-side barrier layer 108 can dramatically reduce the rate of holes tunneling out of the QD layer 110, while having a lesser effect on the rate of tunneling of electrons from the n-side QW layer 106 into the QD layer 110, because the smaller mass of the electrons makes them less susceptible to the effects of a thick barrier layer. No such added barrier thickness is required on the p side of the structure to prevent electrons from tunneling out of the QDs 112 into the p-side QW layer 118, because it is typically possible to design the p-side QW layer 118 such that the lowest electron energy 156 in the p-side electron subband 148 is greater than the lasing electron energy 132 in the QD layer 110, while still keeping the lowest hole energy 154 in the p-side hole subband 146 aligned with the lasing hole energy 134 in the QD layer 110.

Those skilled in the art will recognize that in a typical tunneling semiconductor structure, the tunneling component of current coexists with non-tunneling, thermal (e.g., thermionic) components of the current. In addition, thermally assisted tunneling contributes to the current flowing through the structure. Thermally assisted tunneling is a combination of thermal excitation and tunneling, in which a carrier is raised thermally (i.e., by phonons) to a higher energy level which is still below the top of the barrier. The thermally excited carrier tunnels through the barrier more easily than a non-excited carrier would tunnel.

Figure 2:
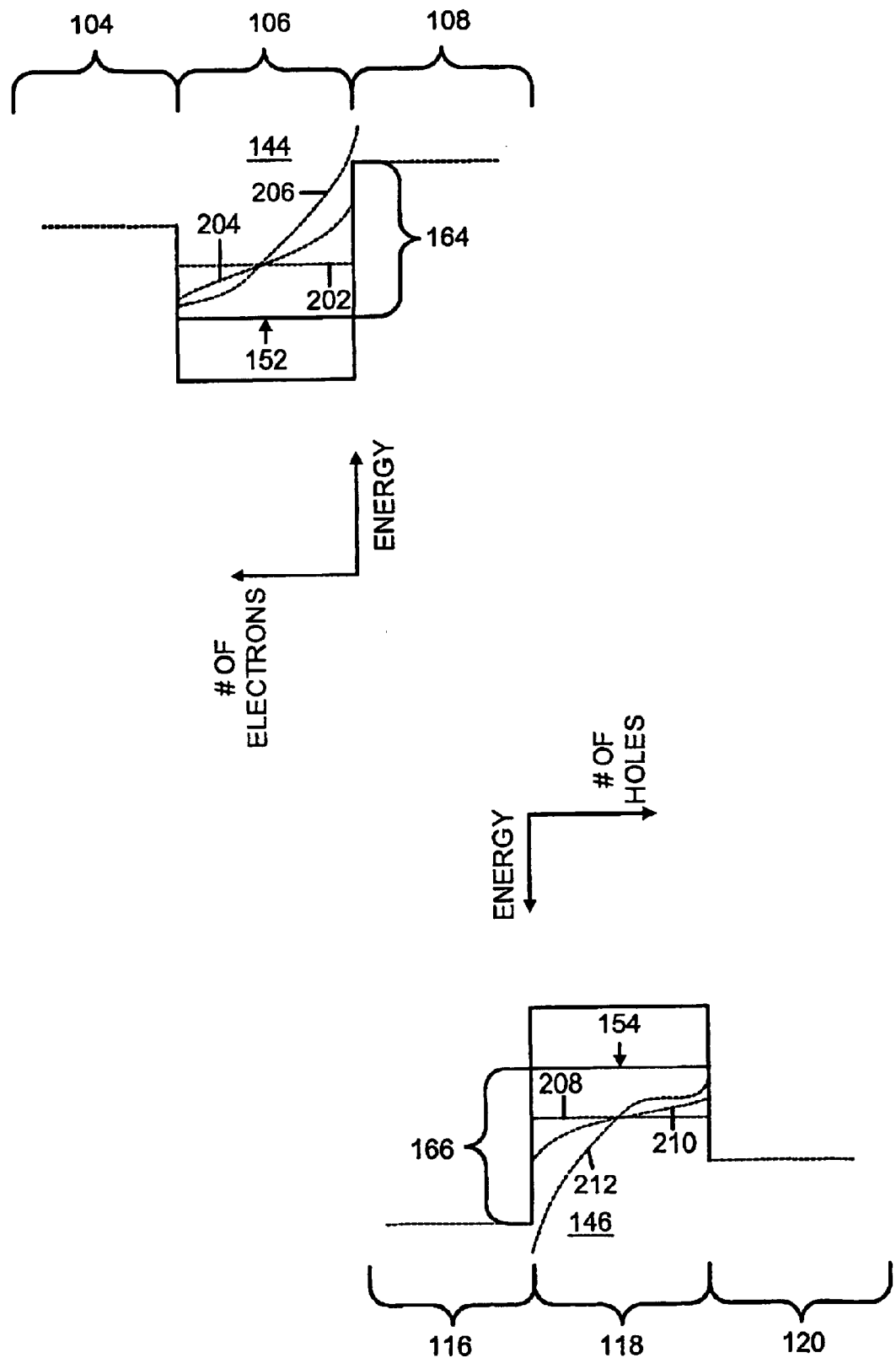
FIG. 2 is a diagram illustrating portions of the valence and conduction bands illustrated in FIG. 1, as well as carrier energy distributions within the bands.

The relative magnitudes of the respective current components depend upon the barrier height, the barrier thickness, and the temperature. For example, consider the parasitic current caused by carriers which—because of the thermal distribution of carrier energies—have sufficient energy to pass through the respective barrier layers 108 and 116 without tunneling. As is illustrated in FIG. 2, the first barrier layer 108 has a particular energy height 164 with respect to the lowest electron energy 152 of the electron subband 144 of the n-side QW layer 106. The distribution of the energies of electrons in the QW layer 106 is temperature-dependent, as will be readily understood by those skilled in the art. At extremely low temperatures, the energy distribution of the electrons is approximately a step function, such that the energy levels below a nearly horizontal line 202 (with energy being represented by the vertical axis of the graph) are fully occupied, whereas the energy levels above the line 202 are empty. At moderate temperatures, the distribution is a curve 204 which tails off at higher energy levels. At higher temperatures, the distribution is a curve 206 which tails off at energy levels higher than those at which the moderate-temperature curve 204 tails off. If the barrier height 164 is sufficiently small, and the temperature is sufficiently high, a significant number of the electrons will have energies, relative to the lowest electron energy 152, which exceed the barrier height 164. Such electrons can pass through the barrier layer 108 without tunneling. The resulting thermally generated current is strongly temperature-dependent due to the temperature dependence of the electron distribution, and it is therefore desirable to suppress the thermally generated current so that it is much smaller than the tunneling current. Accordingly, the material used to form the barrier layer 108 is preferably selected to ensure that the barrier height 164 is greater than the energies of all but an insignificant number of electrons. Provided that the barrier height 164 is sufficiently large, the thermal emission of electrons will be substantially suppressed by the barrier. In other words, the parasitic current caused by thermal emission of electrons—i.e., by energetic electrons passing through the barrier layer 108 without tunneling—should be negligible compared to the current caused by electrons tunneling through the barrier layer 108.

Similarly, the energy distribution of the holes in the p-side QW layer 118 has a strong temperature dependence. At low temperatures, the energy distribution of the holes is essentially a step function—i.e., a horizontal line 208. At moderate temperatures, the distribution is a curve 210 which tails off at higher hole energies. At higher temperatures, the distribution is a curve 212 which tails off at higher energy levels. If the temperature is sufficiently high, and the barrier height 166 with respect to the lowest hole energy level 154 of the hole subband 146 is sufficiently small, then a significant number of the holes will have energies exceeding the height 166 of the barrier. These holes can travel through the barrier layer 116 without tunneling. In order to suppress such thermally generated current—which, as discussed above, has a strong temperature dependence—it is preferable for the barrier height 166 to be greater than the energies of all but an insignificant number of holes. Provided that the barrier height 166 is sufficiently large, the thermal emission of holes will be substantially suppressed by the barrier. In other words, the parasitic current caused by thermal emission of holes—i.e., by energetic holes passing through the barrier layer 116 without tunneling—should be negligible compared to the current caused by holes tunneling through the barrier layer 116.

Consider now the probability of a carrier such as an electron tunneling in a single step through the QD layer 110 and both barrier layers 108 and 116. As is well-known in the art, the probability of a particle tunneling through a barrier is a decreasing exponential function of the barrier thickness, because of the exponential decay of the particle's wave function across the barrier. In the case of an electron tunneling from the n-side QW layer 106, through the first barrier layer 108, through one of the QDs 112 in the QD layer 110, and through the second barrier layer 116 to the p-side QW layer 118, the wave function of the electron does not significantly decay across the QD 112. Therefore, for this electron, the effective combined thickness of the QD layer 110 and the barrier layers 108 and 116 is approximately equal to the combined thicknesses of the barrier layers 108 and 116. Assuming that the barrier layers 108 and 116 are comparable and adequate in thickness, and have sufficient barrier height for electrons, the rate of electron tunneling from the n-side QW layer 106 directly to the p-side QW layer 118 is negligible compared to the rate of tunneling through the first barrier layer 108 alone, because the effective tunneling thickness for electrons tunneling directly from the aside QW layer 106 to the p-side QW layer 118 is approximately double the tunneling thickness for electrons tunneling from the n-side QW layer 106 to the QDs 112.

Similarly, if the barrier layers 108 and 116 have sufficient barrier height for holes, the rate of tunneling of holes directly from the p-side QW layer 118 to the n-side QW layer 106 is negligible compared to the rate of tunneling of holes through the second barrier layer 116 alone, because the effective tunneling thickness for the holes tunneling directly from the p-side QW layer 118 to the n-side QW layer 106 is approximately double the tunneling thickness for holes tunneling from the second QW layer 118 to the QDs 112.

Figure 4:
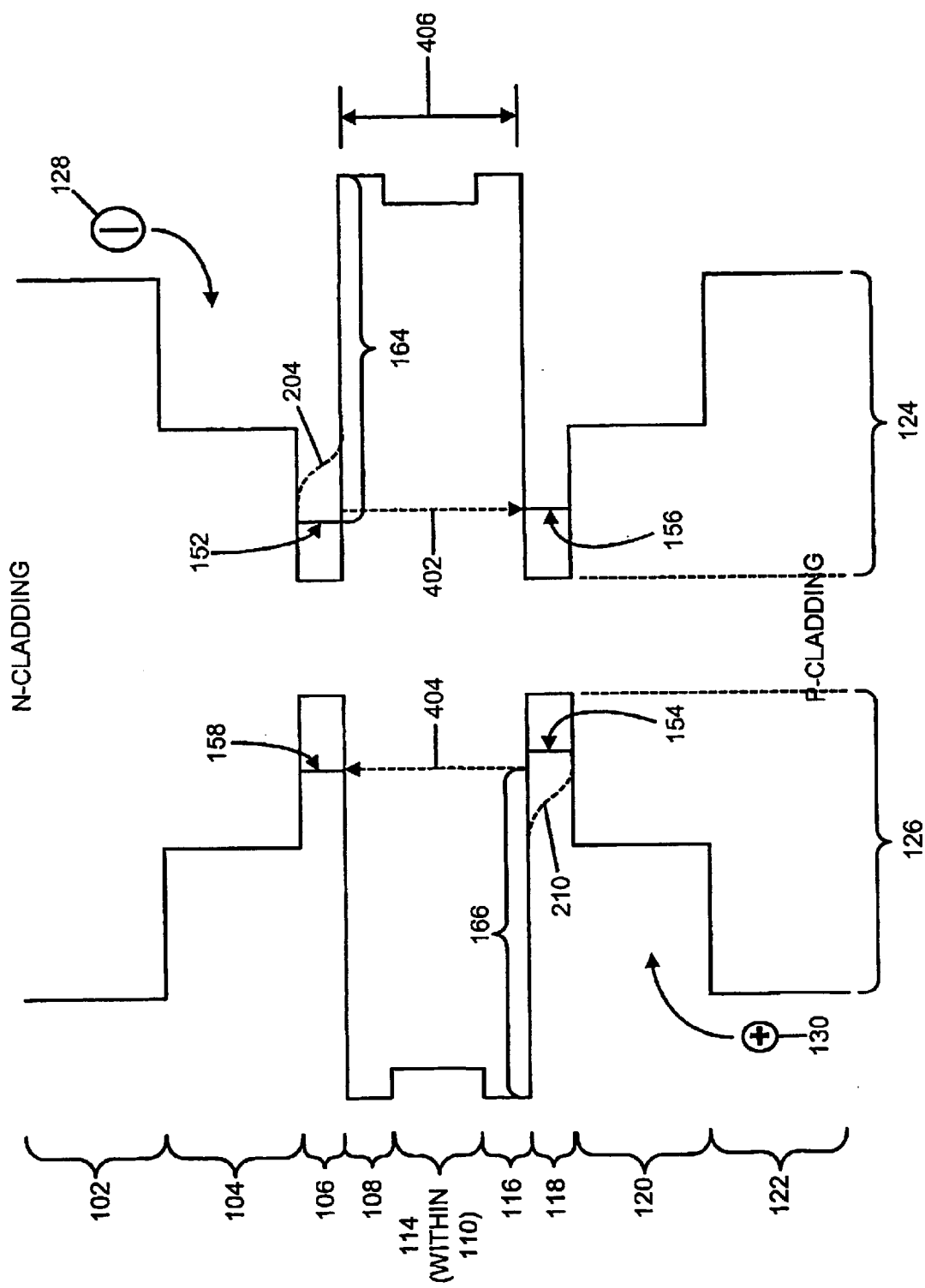
FIG. 4 is a band diagram associated with a current path passing through the QD separation material in the QD layer of the QD laser structure illustrated in FIG. 1.
Figure 5:
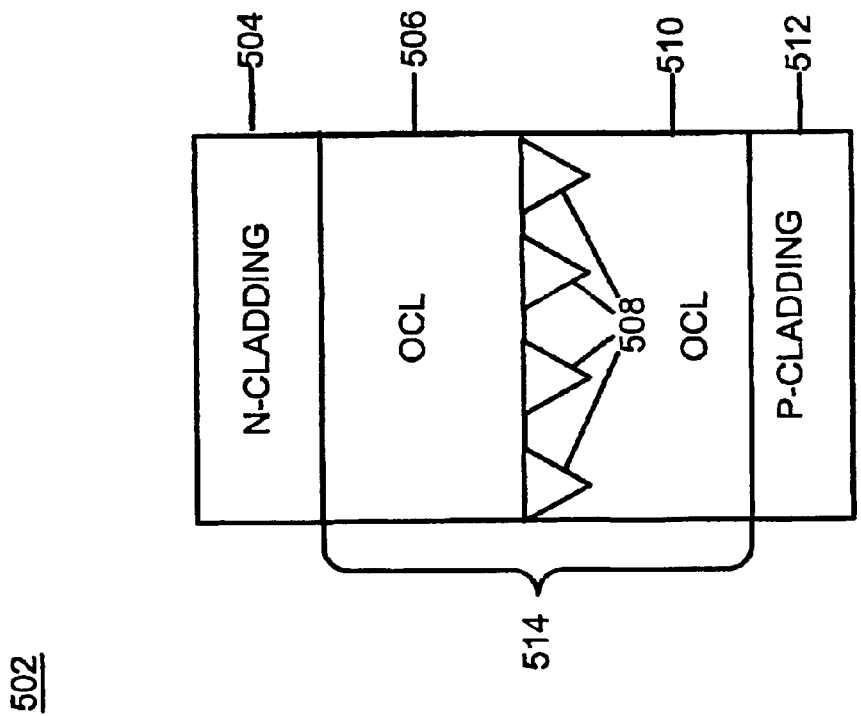
FIG. 5 is a diagram illustrating an exemplary prior art QD laser structure.

In addition to the current paths passing through the QDs 112, there is a possible current path passing through the material 114 separating the QDs 112. However, for a carrier to travel along this current path, it would be necessary for the carrier to tunnel directly between the two QW layers 106 and 118. This tunneling process can be understood by reference to FIG. 4, which illustrates the conduction band 124 and valence band 126 of the parasitic path of current flowing through the material 114 separating the QDs 112 in a QD layer 110. Consider, for example, the probability of an electron 402 tunneling from the n-side QW layer 106 to the p-side QW layer 118 through the separation material 114. Similarly to the material used to form the barrier layers 108 and 116, the separation material 114 in the QD layer 110 has a large band gap. Consequently, the electron wave function decays significantly all the way from the n-side QW layer 106, through both barrier layers 108 and 116 and the QD layer 110, to the p-side QW layer 118. For such an electron, the tunneling distance 406 is the combined thicknesses of the QD layer 110 and both barrier layers 108 and 116. As discussed above with respect to single-step tunneling of carriers through the QDs 112 and both barrier layers 108 and 116, the electron wave function is an exponentially-decaying function of tunneling distance. Therefore, because the total, combined thickness 406 of the QD layer 110 and the barrier layers 108 and 116 is large compared to the thickness 160 of the first barrier 108 alone, the rate at which electrons tunnel directly through all three layers 108, 110, and 116 is very low—insignificant, in fact—compared to the rate at which electrons tunnel through the first barrier layer 108 into the QDs 112. Similarly, consider the likelihood of a hole 404 tunneling from the p-side QW layer 118 directly to the n-side QW layer 106. The rate at which such holes tunnel directly from the p-side QW layer 118 to the n-side QW layer 106 is much lower than the rate at which holes tunnel from the p-side QW layer 118 to the QDs 112, because the combined thickness 406 of all three layers 108, 110, and 116 is much greater than the thickness of the second barrier layer 116 alone. Therefore, in the device of the present invention, the parasitic current caused by direct tunneling of carriers between the QW layers 108 and 116 is negligible.

As discussed above, it is possible for a QD to have more than one electron energy state and/or more than one hole energy state. For example, the QDs 112 illustrated in FIG. 1 have energy levels 132, 184, 186, 134, 188, and 190. In conventional QD lasers, at typical operating temperatures the ratio of the carrier population in a higher energy level to the carrier population in a lower energy level tends to increase as an exponential function of temperature. If one of the energy levels is intended to be used for lasing, and the other level is not, then the presence of electrons in the non-lasing level results in the parasitic effect of carrier recombination producing spontaneous light emission which does not contribute to the laser light. Not only does such parasitic recombination cause excess current through the device, but the value of this current is temperature-dependent. Accordingly, in a conventional structure, because the excess current varies with temperature, the parasitic recombination increases the temperature dependence of the threshold current.

In contrast, in the structure 100 illustrated in FIG. 1, lasing occurs by resonant tunneling from the QW layers 106 and 118 into the QDs 112. By choosing an appropriate thickness for the n-side QW layer 106, the lowest edge 152 of the electron subband 144 in the n-side QW layer 106 can be tuned so that it is equal to, or slightly less than, the QD electron energy level selected for lasing (e.g., the lowest energy level 132 in the QD layer 110). When the laser is operated, electrons resonantly tunnel from the QW electron subband 144 to the selected QD energy level 132. Once such resonant tunneling occurs, the effective resistance between the QW layer 106 and the QD layer 110 becomes extremely small, thereby suppressing further changes in voltage between the QW layer 106 and the QD layer 110. Because further voltage changes between the QW layer 106 and the QD layer 110 are suppressed, the lowest edge 152 of the electron subband 144 locks onto the selected electron energy level 132 in the QD layer 110. Even if the lowest edge 152 of the electron subband 144 is slightly lower than the selected energy level 132 in the QD layer 110 when no bias voltage is applied to the device, the application of a forward bias voltage raises the lowest edge 152 of the electron subband 142 until this edge 152 matches and locks onto the selected lasing energy level 132 in the QD layer 110, thereby giving rise to resonant tunneling. Similarly, the lowest edge 154 of the hole subband 146 in the p-side QW layer 118 is preferably tuned so that it is equal to, or slightly less than, the selected hole lasing energy level (e.g., energy level 134). When a forward bias voltage is applied to the device, the lowest edge 154 of the hole subband 146 locks onto the selected hole energy level 134 in the QD layer 110, resulting in resonant tunneling. Once such resonant tunneling occurs between the p-side QW layer 118 and the QDs 112, the effective resistance between the p-side QW layer 118 and the QD layer 110 becomes very small, thereby suppressing further changes in the voltage between the QW layer 118 and the QD layer 110. As a result, in a device which operates by resonant tunneling, essentially all carriers are injected into the selected electron and hole energy levels (e.g., electron energy level 132 and hole energy level 134). Furthermore, the exchange of carriers among QD electron levels (e.g., levels 132, 184, 186, etc.) and among hole levels (e.g., levels 134, 188, 190, etc.) is relatively slow, provided that the energy separations between energy levels do not equal the energy of an optical phonon, as is discussed below. Therefore, because of the resonant tunneling injection of electrons into level 132, the other levels (i.e., levels 184, 186, etc.) will remain substantially empty, rather than in thermal equilibrium with the lasing energy 132. Similarly, the non-lasing hole levels 188, 190, etc. will be substantially empty, rather than in thermal equilibrium with the hole level 134 being pumped by the resonant tunneling current. The effect of temperature-dependent carrier populations in the respective QD energy levels is thus mitigated by the structure of the present invention.

In order to take fill advantage of the above-described benefit of the resonant tunneling structure of the present invention, the energy separations among the QD electron levels (e.g., the separation between levels 132 and 184 or the separation between levels 132 and 186) and the energy separations among the QD hole energy levels (e.g., the separation between levels 134 and 188 or the separation between levels 134 and 190) should not be equal to the energy of an optical phonon or any other phonon mode having a high density of states and strong interaction with the carriers.

An additional advantage of the laser structure of the present invention is that the resonant tunneling mechanism suppresses violation of charge neutrality in the QDs, which, as discussed above, is one of the mechanisms contributing to temperature dependence of threshold current in conventional QD lasers. In the resonant tunneling structure of the present invention, any charge imbalance in a QD shifts all energy levels of the QD relative to the energy levels of the injecting QW layers 106 and 118. For example, the QD electron level 132 is shifted relative to the electron subband 144 in QW layer 106, and the QD hole level 134 is shifted relative to the hole subband 146 in QW layer 118. Due to the small electrical capacitance of a single QD, the energy shifts caused by an imbalance even as small as the charge of a single electron or a single hole are large enough to substantially suppress resonant tunneling in that QD. Because any QD having non-neutral charge is thus effectively deactivated, current tends to flow only through QDs into which an equal number of electrons and holes have tunneled—i.e., QDs in which charge neutrality has not been violated. Thus, violation of change neutrality, and its effect on the threshold current of the device, is greatly reduced in the resonant tunneling structure 100 of the present invention.

The resonant tunneling mechanism of the laser structure of the present invention has the further advantage of suppressing the effects of inhomogeneity in the characteristics of the QDs 112. In particular, due to resonant tunneling, the lowest edge 152 of the electron subband 144 in the n-side QW layer 106 tends to lock on to the lasing electron energy level 132 of an average-sized QD. Similarly, the lowest edge 154 of the hole subband 146 in the p-side QW layer 118 tends to lock onto the lasing hole energy level 134 of the average-sized QD. As a result, QDs having sizes which deviate significantly from the average size become inactive. Therefore, the structure 100 of the present invention reduces or eliminates the additional temperature-dependence of threshold current associated with QD size variation.

Figure 3A:
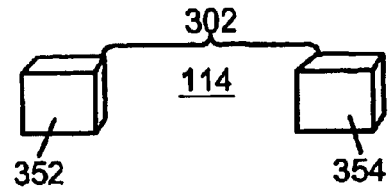
FIG. 3A is a diagram illustrating an exemplary QD layer for use in the QD laser structure illustrated in FIG. 1, as well as valence and conduction bands associated with the illustrated QD layer.
Figure 3A:
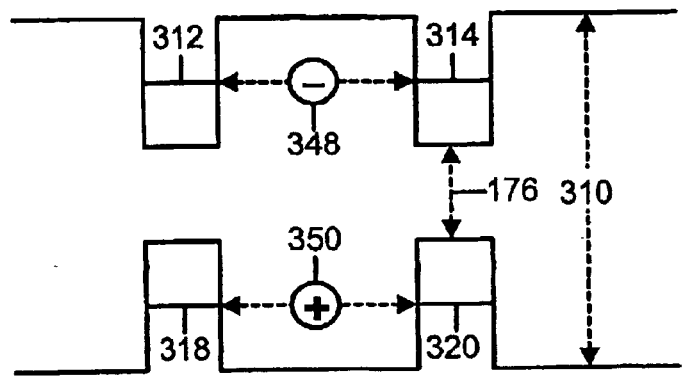

If the QDs 112 in the QD layer 110 are sufficiently close together, tunneling can occur among the QDs 112. For example, FIG. 3A illustrates a pair of QDs 352 and 354 in a QD layer 110. The QDs 352 and 354 are separated by a dot separation distance 302. A separation material 114 fills the volume between the QDs 352 and 354. The separation material 114 has a bandgap 310 which is larger than the bandgap 176 of the QDs 352 and 354. Depending upon the dot separation distance 302 and the difference between the dot separation material bandgap 310 and the QD bandgap 176, it may be possible for electrons 348 and/or holes 350 to tunnel between the QDs. For example, if a first QD 352 has an electron energy level 312, and a second QD 354 has its own electron energy level 314—which is typically approximately equal to the electron energy level 312 of the first QD 352—it is possible for an electron 348 to tunnel from the first QD 352 to the second QD 354, or vice versa. Similarly, if the first QD 352 has a hole energy level 318, and the second QD 354 has an approximately equal hole energy level 320, then it is possible for a hole 350 to tunnel from the first QD 352 to the second QD 354, or vice versa. However, if the separation distance 302 between the respective QDs is sufficiently large, and/or the dot separation material bandgap 310 is sufficiently larger than the dot bandgap 176, then such inter-dot tunneling is substantially suppressed. In other words, the tunneling of carriers among the dots will be suppressed to a level at which the tunneling will have a negligible effect upon the energy states 312, 314, 318, and 320 of the QDs 352 and 354.

Figure 3B:
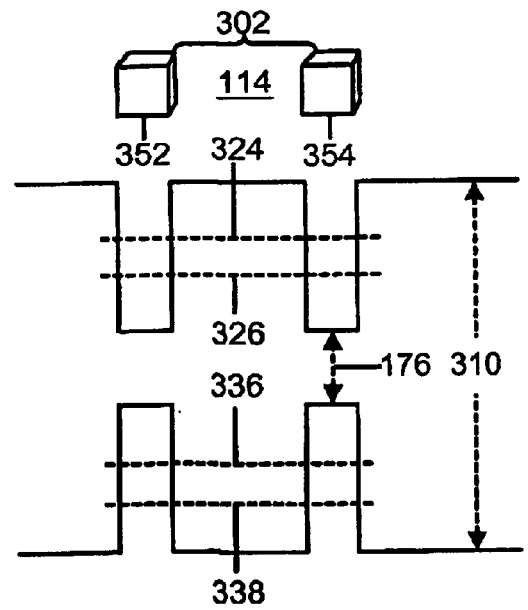
FIG. 3B is a diagram illustrating an additional exemplary QD layer for use in the QD laser structure illustrated in FIG. 1, as well as valence and conduction bands associated with the illustrated QD layer.

On the other hand, as illustrated in FIG. 3B, if the separation distance 302 is sufficiently small, inter-dot tunneling causes the carrier states in the QDs 352 and 354 to interact with each other. The resulting, coupled, two-dot system has energy levels which are different from those of the uncoupled QDs 352 and 354. For example, in the illustrated band diagram, electron states 312 and 314 become electron states 324 and 326, and hole states 318 and 320 become hole states 336 and 338. This phenomenon is often referred to as "tunnel splitting" of energy levels. Increasing the number of coupled QDs increases the number of different energies at which carriers exist.

For most applications, it is preferred for each QD to have only a single predominant electron state and a single predominant hole state, in order to ensure that only one lasing energy gap is active in the device. In fact, if many of the QDs are very strongly coupled to each other, the number of discrete energy levels in the QD layer can be so numerous that the levels form a nearly continuous energy band. If so, the QD layer will behave more like a QW layer than a true QD layer. Therefore, in most cases, it is preferable that the separation distance 302 among the QDs 112 is sufficiently large to prevent significant tunneling/coupling among the QDs 112. A suitable separation distance 302 is typically between 300 Å and 700 Å.

It is to be noted that even if the average separation between QDs is sufficiently large that tunnel splitting is negligible, it may still be possible for a small number of QD pairs to be close enough to cause significant tunnel splitting in these pairs. The effect of such tunnel splitting in a small number of QDs is similar to the effect of QD size variation discussed above. However, in the resonant-tunneling structure of the present invention, the tunnel-split levels of a pair of closely spaced QDs will not be in resonance with the carriers being injected into the QDs, and the QD pair will therefore not be effectively pumped by the bias current. Accordingly, temperature-sensitivity associated with coupled QDs is reduced or eliminated in the resonant tunneling structure 100 of the present invention.

Figure 6:
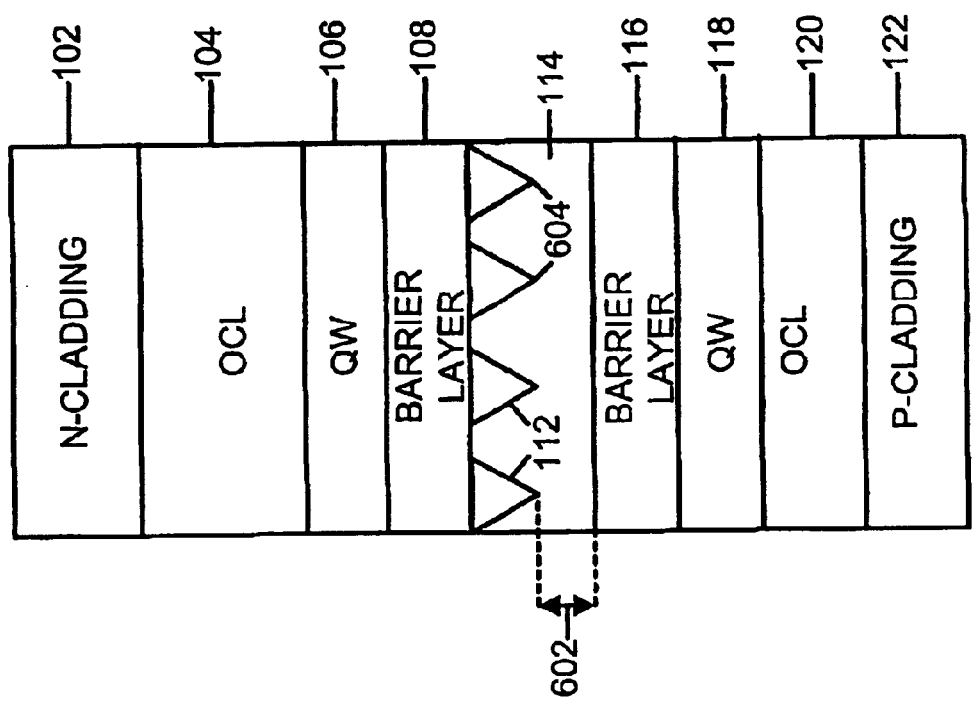
FIG. 6 is a diagram illustrating an exemplary QD laser structure in accordance with the present invention.

The QDs 112 illustrated in FIG. 1 are prismatic in shape. However, QDs in accordance with the present invention can also have a pyramidal geometry, as illustrated in FIG. 6. In particular, as is well-known in the art, typical methods of forming self-organized QDs result in pyramidal QDs with square bases. If such pyramidal QDs 112 are used in the structure 100 of the present invention, then the distance 602 between the tips 604 of the QDs 112 and the barrier layer adjacent to the tips 604 (e.g., the p-side barrier layer 116) should be small enough to allow carriers (e.g., holes) to easily tunnel into the QDs 112 from the QW layer (e.g., layer 118) on the other side of the barrier layer (e.g., layer 116).

Figure 8:
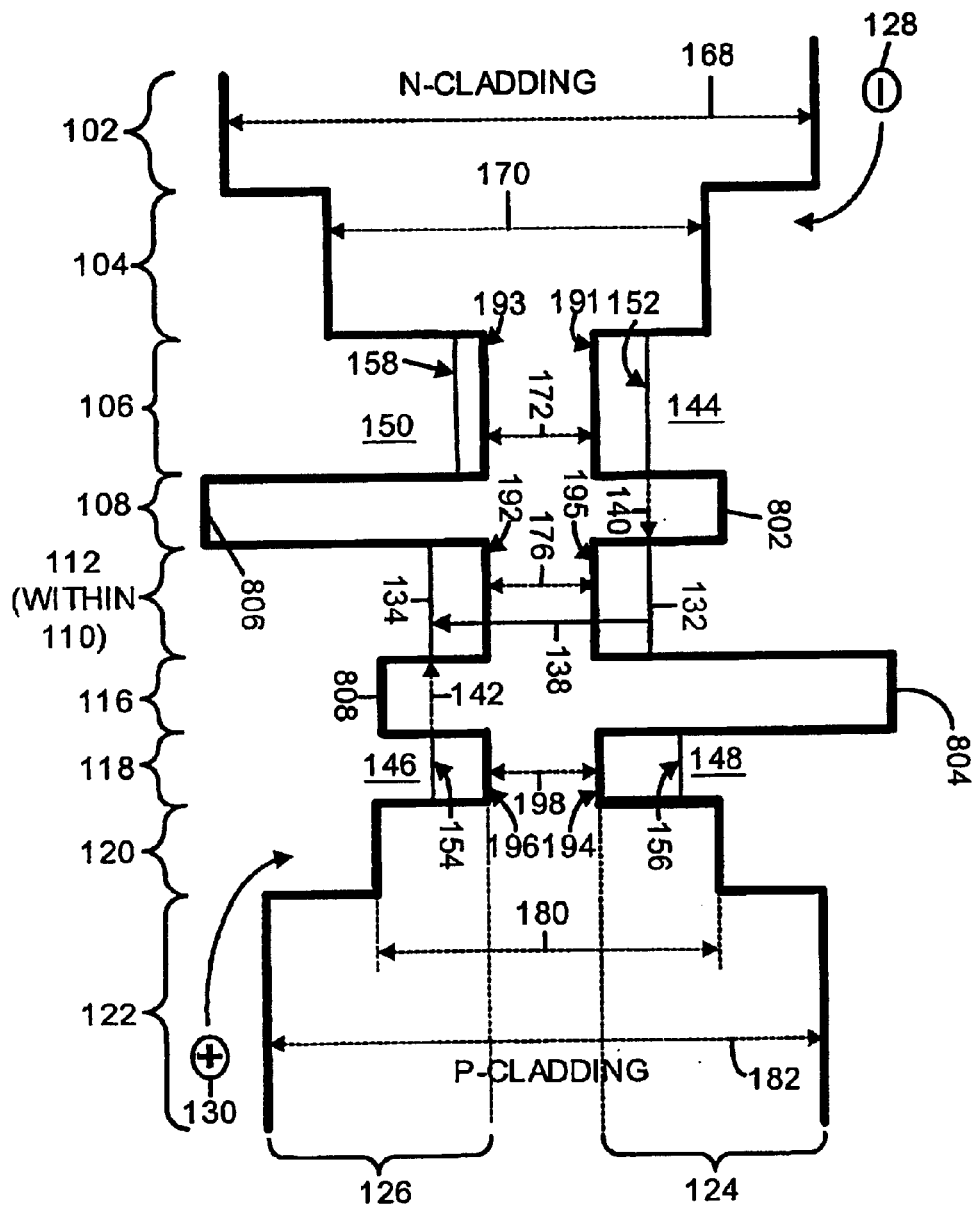
FIG. 8 is a diagram illustrating valence and conduction bands associated with an additional exemplary QD laser structure in accordance with the present invention.

In accordance with a preferred embodiment of the laser structure of the present invention, the QD material, the respective QW materials, and the respective barrier materials can be selected such that an electron or hole is subjected to a low barrier for entering the QDs 112 and a high barrier for exiting the QDs 112. FIG. 8 is a band diagram of such a structure. In this structure, the n-side barrier layer 108 and the p-side barrier layer 116 are formed from different materials. Exemplary materials which can be used to form such a structure are listed in Table I, which is discussed in further detail below. In the illustrated example, the n-side barrier layer 108 has relatively low conduction band offsets, but relatively high valence band offsets, with respect to the QDs 112 and the n-side QW layer 106. As a result, electrons entering the QDs 112 are subjected to a low conduction band barrier energy 802, whereas holes leaving the QDs 112 are subjected to a high valence band barrier energy 806. In contrast, the p-side barrier layer 116 has relatively high conduction band offsets, but relatively low valence band offsets, with respect to the QDs 112 and the p-side QW layer 118. As a result, electrons leaving the QDs 112 are subjected to a high conduction band barrier energy 804, whereas holes entering the QDs are subjected to a low valence band barrier energy 808. It can therefore be seen that it is easy for electrons and holes to enter the QDs 112 via tunneling (inducing thermally assisted tunneling) and/or thermionic emission, because the conduction band energy 802 of the n-side barrier layer 108 is quite low and the valence band energy 808 of the p-side barrier layer 116 is also quite low; yet, it is difficult for electrons and holes to exit the QDs 112 because the conduction band energy 804 of the p-side barrier layer 116 is quite high and the valence band energy 806 of the n-side barrier layer 108 is also quite high. Accordingly, because it is easy for carriers to enter the QDs 112, but difficult for the carriers to exit the QDs 112, the parasitic current caused by carriers exiting the QDs 112 is greatly reduced.

The materials and geometries of the QDs 112 and the barrier layers 108 and 116 should be selected so that both electrons and holes can readily tunnel into the QDs 112. This is best accomplished by selecting materials and geometries based on the following equation:

$$m_c^{barrier}(\Delta E_c - \epsilon_n) \approx m_v^{barrier}(\Delta E_v - \epsilon_p), \quad (1)$$

where: $m_c^{barrier}$ is the electron effective mass in the n-side barrier layer 108; $m_v^{barrier}$ is the hole effective mass in the p-side barrier layer 116; $\Delta E_c$ is the conduction band offset at the heteroboundary between the QD layer 110 (in particular, the QDs 112) and the n-side barrier layer 108; $\Delta E_v$ is the valence band offset at the heteroboundary between the QD layer 110 (in particular, the QDs 112) and the p-side barrier layer 116; $\epsilon_n$ is the quantized electron energy level in a particular QD or an average-sized QD; and $\epsilon_p$ is the quantized hole energy level in a particular QD or an average-sized QD.

Table I lists a set of exemplary materials which can be used to fabricate a QD laser structure 100 having the bands 124 and 126 illustrated in FIG. 8, and also lists the corresponding bandgap $E_g$ of each of these materials. Table II lists the resulting conduction band offset $\Delta E_c$ and valence band offset $\Delta E_v$ for each of the heteroboundaries resulting from the use of the materials listed in Table I. The listed materials are preferably formed using molecular beam epitaxy (MBE) and/or metal-organic chemical vapor deposition (MOCVD). MBE and MOCVD are well-known processes for thin semiconductor film growth.

TABLE I

| Layer | Material | $E_g$ (eV) |
|---|---|---|
| Cladding layers (102 and 122) | InP | 1.35 |
| OCLs (104 and 120) and QD separation mat'l (114) | $Ga_{0.2}In_{0.8}As_{0.44}P_{0.56}$ | 1.01 |
| QW layers (106 and 118) | $Ga_{0.47}In_{0.53}As$ | 0.717 |
| $Barrier_2$ (116) | $Al_{0.48}In_{0.52}As$ | 1.4 |
| $Barrier_1$ (108) | $Ga_{0.14}In_{0.86}As_{0.3}P_{0.7}$ | 1.108 |
| QDs (112) | InAs | 0.36 |

TABLE II

| Boundary | $\Delta E_c$ (eV) | $\Delta E_v$ (eV) |
|---|---|---|
| n-Cladding/$OCL_1$ (102/104) | 0.133 | 0.207 |
| $OCL_1$/$QW_1$ (104/106) | 0.114 | 0.179 |

TABLE II-continued

| Boundary | $\Delta E_c$ (eV) | $\Delta E_v$ (eV) |
|---|---|---|
| $QW_1$/$barrier_1$ (106/108) | 0.152 | 0.239 |
| $Barrier_2$/$QW_2$ (116/118) | 0.52 | 0.163 |
| $QW_2$/$OCL_2$ (118/120) | 0.114 | 0.179 |
| $OCL_2$/p-cladding (120/122) | 0.133 | 0.207 |

If the materials listed in Table I are used, the thickness of the QD layer 112 is preferably in the range of 50–150 Å. If the QDs are self-organized, each QD is typically pyramidal with a square base. The mean size of the QDs typically ranges from 50–150 Å, with approximately a 10% statistical variation in the QD sizes. The surface density of QDs in the QD layer 110 is typically $2 \times 10^{10} - 1 \times 10^{11}$ cm$^{-2}$, which corresponds to a separation distance of 700–300 Å between the centers of adjacent QDs. A QD separation distance within this range is typically sufficient to prevent tunnel splitting of the carrier states in the QDs.

The thicknesses of the QW layers 106 and 118 and the size(s) of the QDs 112 determine, respectively, the positions of the QW subband edges 152, 154, 156, and 158 and the quantized QD energy levels 132, 134, 184, 186, 188, and 190. The appropriate QW thicknesses can be determined using conventional numerical techniques which calculate the QD energy levels based on QD shape and size. Estimates of the appropriate QW thicknesses can be obtained by neglecting the penetration of the QW electron and hole wave functions into the barrier regions. Based on such an approximation, a suitable value of the n-side QW thickness is 165 Å, and a suitable value of the p-side QW thickness is 95 Å. Typically, the preferred thicknesses of the QW layers 106 and 118 are in the range of 20–200 Å.

If the above-listed dimensions are used, then the gap between the lowest electron energy level 152 and the lowest hole energy level 158 in the n-side QW layer 106 is 0.754 eV, and the gap between the lowest electron energy level 156 and the lowest hole energy level 154 in the p-side QW layer 118 is approximately 0.829 eV. The height 164 of the barrier in the first barrier layer 108 with respect to the lowest electron energy level 152 in the n-side QW layer 106 is 0.118 eV, and the height 166 of the barrier in the second barrier layer 116 with respect to the lowest hole energy level 154 in the p-side QW layer 118 is approximately 0.153 eV. The gap between the electron energy level 132 and the hole energy level 134 in the QD layer 110 is approximately 0.80 eV, and as a result, photons generated by lasing in the device have an energy of 0.80 eV. This photon energy corresponds to a photon wavelength λ of 1.55 μm, which is currently the most useful wavelength for telecommunications applications. As is well known to those skilled in the art, the optimal thickness of the OCL is chosen so as to maximize the optical confinement factor. For a laser emitting at λ=1.55 μm, the thickness of each of the OCLs 104 and 120 is typically 1000–1500 Å.

As is discussed above, the n-side barrier layer 108 is preferably thin enough to allow significant tunneling of electrons from the n-side QW layer 106 into the QDs 112, yet thick enough to significantly suppress the tunneling of holes from the QDs 112 into the n-side QW layer 106. Similarly, the p-side barrier layer 116 is preferably thin enough to allow significant tunneling of holes from the p-side QW layer 118 into the QDs 112, yet thick enough to significantly suppress the tunneling of electrons from the QDs 112 into the p-side QW layer 118. The tunneling rates $R_e$ and $R_h$ of electrons and holes through a barrier of thickness d can be estimated using the following equations:

$$R_e = \frac{\varepsilon_n}{\hbar}\exp\left[-2\frac{\sqrt{2m_c^{barrier}(\Delta E_c - \varepsilon_n)}}{\hbar}d\right]; \text{ and} \quad (2)$$

$$R_h = \frac{\varepsilon_p}{\hbar}\exp\left[-2\frac{\sqrt{2m_v^{barrier}(\Delta E_v - \varepsilon_p)}}{\hbar}d\right]. \quad (3)$$

For the materials listed in Table I, an application of Eqs. (2) and (3) indicates that the preferred thicknesses of the barrier layers 108 and 116 are approximately 10–20 Å.

In accordance with an additional aspect of the present invention, carriers can originate on one side of a laser structure, and can be injected non-resonantly into a QD layer, yet can be blocked from reaching the other side of the structure and becoming minority carriers. A band diagram of such a structure is provided in FIG. 9. Similarly to the structure 100 illustrated in FIG. 1, the structure 900 illustrated in FIG. 9 includes a QD layer 110 having QDs 112 separated by a separation material 114; barrier layers 108 and 116; and n-type and p-type cladding layers 102 and 122. However, rather than having both OCL layers and QW layers, the structure 900 illustrated in FIG. 9 includes only OCL layers 902 and 904 which are preferably formed from low band gap materials, but need not be thin enough to exhibit significant QW behavior. Similarly to the structure discussed above with reference to FIG. 8, the structure 900 illustrated in FIG. 9 includes a n-side barrier layer 108 having a low conduction band electron energy 802 and a high valence band hole energy 806. The structure 900 also includes a p-side barrier layer 116 having a high conduction band electron energy 804 and a low valence band hole energy 808. An electron 128 on the n-side of the structure can enter the n-side OCL layer 902, and because the conduction band electron energy 802 of the aside barrier layer 108 is very low, it is easy for the electron 128 to pass through the barrier layer 108 into the QD layer 110 by tunneling (including thermally-assisted tunneling) or thermionic injection. The n-side barrier layer 108 has a high "transparency" for electrons traveling from OCL layer 902 to the QD layer 110—i.e., the layer 108: (a) is thin enough and/or has a sufficiently low conduction band electron energy 802 to enable a significant number of the electrons to tunnel through it by thermally assisted tunneling and/or non-thermally-assisted tunneling; and/or (b) has a sufficiently low conduction band electron energy 802 to enable a significant number of the electrons to be thermally emitted from OCL layer 902 to the QD layer 110. Similarly, a hole originating on the p-side of the structure can enter the p-side OCL layer 904. The p-side barrier layer 116 has a high transparency for holes traveling from OCL layer 904 to the QD layer 110—i.e., the layer 116: (a) is thin enough and/or has a sufficiently low valence band hole energy 808 to enable a significant number of holes to tunnel through it by thermally assisted tunneling and/or non-thermally-assisted tunneling; and/or (b) has a sufficiently low valence band hole energy 808 to enable significant thermal emission of holes from OCL layer 904 into the QD layer 110.

Yet, the n-side barrier layer 108 should have a low transparency for holes traveling from the QD layer 110 to OCL layer 902, and the p-side barrier layer 116 should have a low transparency for electrons traveling from the QD layer 110 to OCL layer 904. In other words, the n-side barrier layer 108 should be thick enough to substantially suppress tunneling of holes out of the QD layer 110 into OCL layer 902, and/or should have a valence band hole energy 806 which is sufficiently high to substantially suppress thermal emission of holes from the QD layer 110 to OCL layer 902; similarly, the p-side barrier layer 116 should be thick enough to substantially suppress tunneling of electrons out of the QD layer 110 into OCL layer 904 and/or should have a sufficiently high conduction band electron energy 804 to substantially suppress thermal emission of electrons from the QD layer 110 to OCL layer 904. There is, of course, a trade-off between making the barrier layers 108 and 116 thick enough to suppress the tunneling of carriers out of the QD layer 110, while being thin enough to enable tunneling of carriers into the QD layer 110. However, as discussed above, the tunneling mechanism is not temperature dependent, and therefore, suppression of tunneling of carriers out of the QD layer 110 is less important than the suppression of thermal emission of carriers out of the QD layer 110. Accordingly, in order to maintain the temperature-insensitivity of the laser structure, it is sufficient to ensure that the n-side barrier layer 108 has a high valence band hole energy 806, and that the p-side barrier layer 116 has a high conduction band electron energy 804. Because the high conduction band electron energy 804 of the p-side barrier layer 116 prevents electrons from reaching the p-side of the structure, and because the high valence band hole energy 806 of the n-side barrier layer 108 prevents holes from reaching the n-side of the structure, recombination of carriers outside the QD layer 110 is suppressed. As a result, the above-described structure has greatly reduced temperature sensitivity. Preferably, the conduction band electron energy 804 of the p-side barrier layer 116 is greater than the conduction band electron energy 802 of the n-side barrier layer 108, and the valence band hole energy 806 of the n-side barrier layer 108 is greater than the valence band hole energy 808 of the p-side barrier layer 116, in order to ensure that carriers can easily enter the QD layer 110, but cannot easily leave the QD layer 110.

Figure 9:
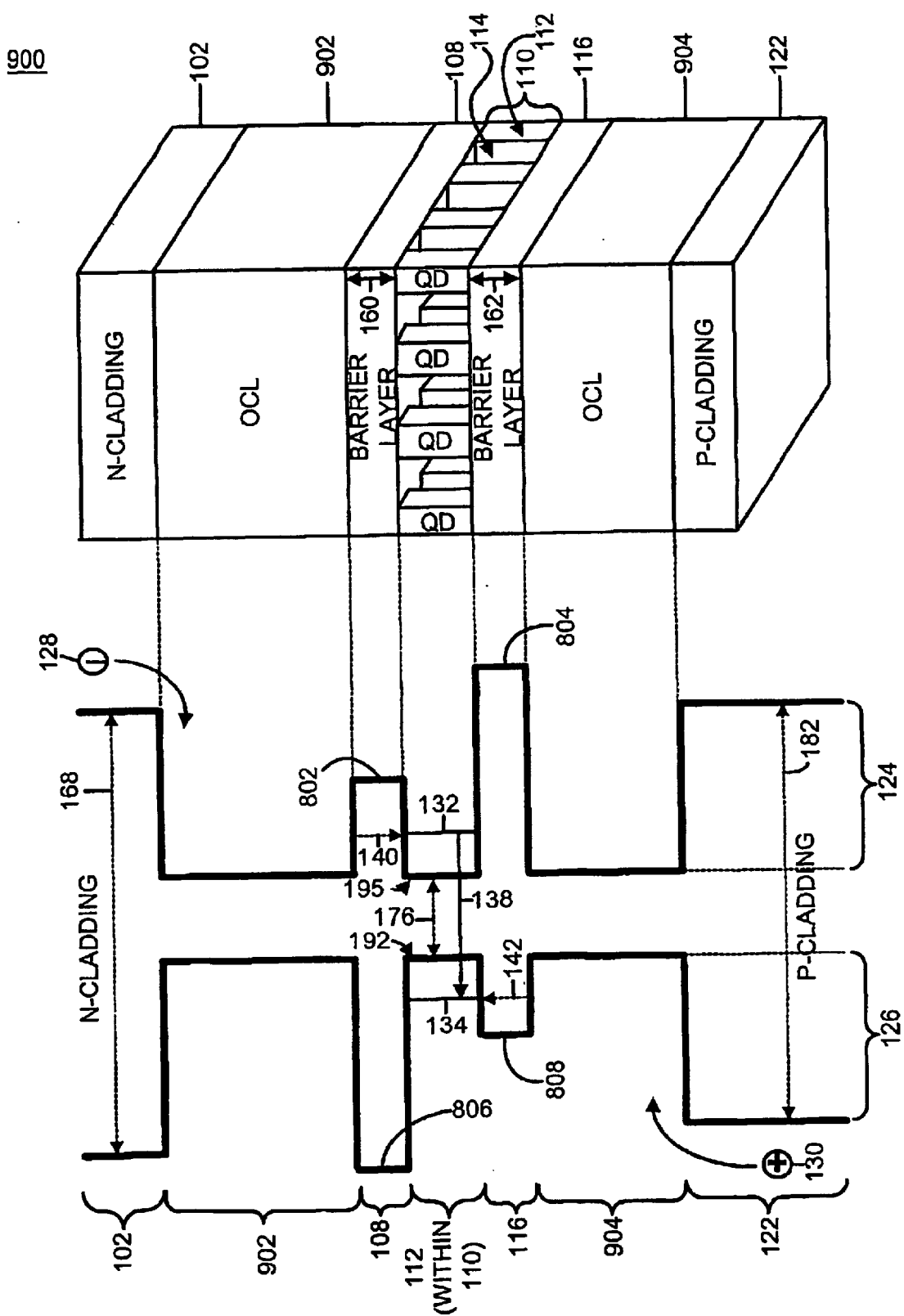
FIG. 9 is a diagram illustrating yet another exemplary QD laser structure, and associated valence and conduction bands, in accordance with the present invention.

It is further to be noted that the structure illustrated in FIG. 9 has the additional advantage of not requiring any special alignment of QW and QD energy levels.

Table III lists exemplary materials suitable for forming the structure illustrated in FIG. 9, and also lists the corresponding bandgap $E_g$ of each of these materials. Table IV lists the resulting conduction band offset $\Delta E_c$ and valence band offset $\Delta E_v$ for each of the heteroboundaries resulting from the use of the materials listed in Table III.

TABLE III

| Layer | Material | $E_g$ (eV) |
| --- | --- | --- |
| Cladding layers (102 and 122) | InP | 1.35 |
| QD separation mat'l (114) | $Ga_{0.2}In_{0.8}As_{0.44}P_{0.56}$ | 1.01 |
| OCL layers (902 and 904) | $Ga_{0.47}In_{0.53}As$ | 0.717 |
| Barrier$_2$ (116) | $Al_{0.48}In_{0.52}As$ | 1.4 |
| Barrier$_1$ (108) | $Ga_{0.14}In_{0.86}As_{0.3}P_{0.7}$ | 1.108 |
| QDs (112) | InAs | 0.36 |

TABLE IV

| Boundary | $\Delta E_c$ (eV) | $\Delta E_v$ (eV) |
| --- | --- | --- |
| n-Cladding/n-side OCL layer (102/902) | 0.247 | 0.386 |
| n-side OCL layer/barrier$_1$ (902/108) | 0.152 | 0.239 |
| Barrier$_2$/p-side OCL layer (116/904) | 0.52 | 0.163 |

TABLE IV-continued

| Boundary | $\Delta E_c$ (eV) | $\Delta E_v$ (eV) |
|---|---|---|
| p-side OCL layer/ p-cladding (904/122) | 0.247 | 0.386 |

Although the present invention has been described in connection with specific exemplary embodiments, it should be understood that various changes, substitutions, and alterations apparent to those skilled in the art can be made to the disclosed embodiments without departing from the spirit and scope of the invention as set forth in the appended claims.

What is claimed is:

1. A semiconductor structure, comprising:
   a first barrier layer having a first barrier thickness;
   a second barrier layer having a second barrier thickness;
   a quantum dot layer including at least one quantum dot, the quantum dot layer being disposed between the first and second barrier layers;
   a first quantum well layer, the first barrier layer being disposed between the first quantum well layer and the quantum dot layer, and the first barrier thickness being sufficiently small to enable electrons to tunnel from the first quantum well layer to the quantum dot layer; and
   a second quantum well layer, the second barrier layer being disposed between the second quantum well layer and the quantum dot layer, and the second barrier thickness being sufficiently small to enable holes to tunnel from the second quantum well layer to the quantum dot layer.

2. A semiconductor structure according to claim 1, further comprising:
   a first optical confinement layer, the first quantum well layer being disposed between the first optical confinement layer and the first barrier layer; and
   a second optical confinement layer, the second quantum well layer being disposed between the second optical confinement layer and the second barrier layer.

3. A semiconductor structure according to claim 2, further comprising:
   an n-type cladding layer, the first optical confinement layer being disposed between the n-type cladding layer and the first quantum well layer; and
   a p-type cladding layer, the second optical confinement layer being disposed between the p-type cladding layer and the second quantum well layer.

4. A semiconductor structure according to claim 3, wherein recombination of electrons tunneled from the first quantum well layer with holes tunneled from the second quantum well layer for generating photons takes place in the at least one quantum dot.

5. A semiconductor structure according to claim 1, wherein recombination of electrons tunneled from the first quantum well layer with holes tunneled from the second quantum layer for generating photons takes place in the at least one quantum dot.

6. A semiconductor structure according to claim 1, further comprising:
   an n-type cladding layer, the first quantum well layer being disposed between the n-type cladding layer and the first barrier layer; and
   a p-type cladding layer, the second quantum well layer being disposed between the p-type cladding layer and the second barrier layer.

7. A semiconductor structure according to claim 1, wherein the first quantum well layer has an electron subband, the electron subband having a lowest electron subband energy level, the at least one quantum dot having a quantized electron energy level of at least one of a particular quantum dot and an average-sized quantum dot, and the lowest electron subband energy level being approximately equal to the quantized electron energy level.

8. A semiconductor structure according to claim 7, wherein the second quantum well layer has a hole subband, the hole subband having a lowest hole subband energy level, the at least one quantum dot further having a quantized hole energy level of at least one of a particular quantum dot and an average-sized quantum dot, and the lowest hole subband energy level being approximately equal to the quantized hole energy level.

9. A semiconductor structure according to claim 8, wherein the first barrier layer has an electron energy barrier with respect to the lowest electron subband energy level, the electron energy barrier having a height with respect to the lowest electron subband energy level that is sufficiently large to substantially prevent thermal emission of the electrons from the first quantum well layer to the quantum dot layer, and wherein the second barrier layer has a hole energy barrier with respect to the lowest hole subband energy level, the hole energy barrier having a height with respect to the lowest hole subband energy level that is sufficiently large to substantially prevent thermal emission of the holes from the second quantum well layer to the quantum dot layer.

10. A semiconductor structure according to claim 1, wherein the first quantum well layer has an electron subband, the electron subband has a lowest electron subband energy level, the first barrier layer having an electron energy barrier with respect to the lowest electron subband energy level, the electron energy barrier having a height with respect to the lowest electron subband energy level that is sufficiently large to substantially prevent thermal emission of the electrons from the first quantum well layer to the quantum dot layer, and wherein the second quantum well layer has a hole subband, the hole subband having a lowest hole subband energy level, the second barrier layer having a hole energy barrier with respect to the lowest hole subband energy level, and the hole energy barrier having a height with respect to the lowest hole subband energy level that is sufficiently large to substantially prevent thermal emission of the holes from the second quantum well layer to the quantum dot layer.

11. A semiconductor structure according to claim 1, wherein the second quantum well layer has a hole subband, the hole subband having a lowest hole subband energy level, the at least one quantum dot having a quantized hole energy level of at least one of a particular quantum dot and an average-sized quantum dot, and the lowest hole subband energy level being approximately equal to the quantized hole energy level.

12. A semiconductor structure according to claim 1, wherein the at least one quantum dot comprises at least a first quantum dot and a second quantum dot, the first quantum dot having a first electron energy level and a first hole energy level, the second quantum dot having a second electron energy level and a second hole energy level, the first and second quantum dots being separated by a dot separation distance that is sufficiently large to prevent tunnel splitting of the first and second electron energy levels and the first and second hole energy levels.

13. A semiconductor structure according to claim 1, wherein the at least one quantum dot comprises at least a first quantum dot and a second quantum dot, the quantum dot layer further including material separating at least the first and second quantum dots, the first quantum dot having a first quantum dot bandgap, the second quantum dot having a second quantum dot bandgap, the material separating at least the first and second quantum dots having a dot separation material bandgap, and the dot separation material bandgap being sufficiently larger than the first and second quantum dot bandgaps to substantially prevent tunneling of the electrons and holes between the first and second quantum dots.

14. A semiconductor structure according to claim 1, wherein the at least one quantum dot has a quantized electron energy level of at least one of a particular quantum dot and an average-sized quantum dot, the at least one quantum dot having a quantized hole energy level of at least one of a particular quantum dot and an average-sized quantum dot, the first quantum well layer having a hole subband, the hole subband having a lowest hole subband energy level, the lowest hole subband energy level being greater than the quantized hole energy level, the second quantum well layer having an electron subband, the electron subband having a lowest electron subband energy level, and the lowest electron subband energy level being greater than the quantized electron energy level.

15. A semiconductor structure according to claim 1, wherein the at least one quantum dot has a quantized electron energy level of at least one of a particular quantum dot and an average-sized quantum dot, the second quantum well layer having an electron subband, the electron subband having a lowest electron subband energy level, and the lowest electron subband energy level being greater than the quantized electron energy level.

16. A semiconductor structure according to claim 1, wherein the at least one quantum dot has a quantized hole energy level of at least one of a particular quantum dot and an average-sized quantum dot, the first quantum well layer having a hole subband, the hole subband having a lowest hole subband energy level, and the lowest hole subband energy level being greater than the quantized hole energy level.

17. A semiconductor structure according to claim 1, wherein the at least one quantum dot has a quantized electron energy level $\epsilon_n$ of at least one of a particular quantum dot and an average-sized quantum dot, and wherein the at least one quantum dot has a quantized hole energy level $\epsilon_p$ of the at least one of a particular quantum dot and an average-sized quantum dot, electrons in the first barrier layer having an electron effective mass $m_c^{barrier}$, holes in the second barrier layer having a hole effective mass $m_v^{barrier}$, a boundary between the quantum dot layer and the first barrier layer having a conduction band offset $\Delta E_c$, a boundary between the quantum dot layer and the second barrier layer having a valence band offset $\Delta E_v$, and the value of the expression $m_c^{barrier}(\Delta E_c - \epsilon_n)$ being approximately equal to the value of the expression $m_v^{barrier}(\Delta E_v - \epsilon_p)$.

18. A semiconductor structure, comprising:
  a first barrier layer;
  a second barrier layer;
  a quantum dot layer including at least one quantum dot, the quantum dot layer being disposed between the first and second barrier layers;
  an n-side optical confinement layer, the first barrier layer being disposed between the n-side optical confinement layer and the quantum dot layer, the first barrier layer having an amount of transparency for electrons being transported from the n-side optical confinement layer to the quantum dot layer through the first barrier layer, and the first barrier layer having an amount of transparency for holes being transported from the quantum dot layer to the n-side optical confinement layer through the first barrier layer; and
  a p-side optical confinement layer, the second barrier layer being disposed between the p-side optical confinement layer and the quantum dot layer, the second barrier layer having an amount of transparency for holes being transported from the p-side optical confinement layer to the quantum dot layer through the second barrier layer, and the second barrier layer having an amount of transparency for electrons being transported from the quantum dot layer to the p-side optical confinement layer through the second barrier layer, wherein the amount of transparency for electrons being transported from the n-side optical confinement layer to the quantum dot layer through the first barrier layer is greater than the amount of transparency for electrons being transported from the quantum dot layer to the p-side optical confinement layer through the second barrier layer, and the amount of transparency for holes being transported from the p-side optical confinement layer to the quantum dot layer through the second barrier layer is greater than the amount of transparency for holes being transported from the quantum dot layer to the n-side optical confinement layer through the first barrier layer.

19. A semiconductor structure according to claim 18, further comprising:
  an n-type cladding layer, the n-side optical confinement layer being disposed between the n-type cladding layer and the first barrier layer; and
  a p-type cladding layer, the p-side optical confinement layer being disposed between the p-type cladding layer and the second barrier layer.

20. A semiconductor structure according to claim 19, wherein recombination of electrons being transported from the n-side optical confinement layer to the quantum dot layer with holes being transported from the p-side optical confinement layer to the quantum dot layer for generating photons takes place in the at least one quantum dot.

21. A semiconductor structure according to claim 18, wherein recombination of electrons being transported from the n-side optical confinement layer to the quantum dot layer with holes being transported from the p-side optical confinement layer to the quantum dot layer for generating photons takes place in the at least one quantum dot.

22. A semiconductor structure according to claim 21, wherein the first barrier layer has a first valence band hole energy level and a first conduction band electron energy level, the second barrier layer has a second valence band hole energy level and a second conduction band electron energy level, the first valence band hole energy level being greater than the second valence band hole energy level, and the second conduction band electron energy level being greater than the first conduction band electron energy level.

23. A semiconductor structure according to claim 18, wherein the first barrier layer has a first valence band hole energy level and a first conduction band electron energy level, the second barrier layer has a second valence band hole energy level and a second conduction band electron energy level, the first valence band hole energy level being greater than the second valence band hole energy level, and the second conduction band electron energy level being greater than the first conduction band electron energy level.

24. A semiconductor structure according to claim 18, wherein the at least one quantum dot comprises at least a first quantum dot and a second quantum dot, the first quantum dot has a first electron energy level and a first hole energy level, the second quantum dot has a second electron energy level and a second hole energy level, the first and second quantum dots being separated by a dot separation distance that is sufficiently large to prevent tunnel splitting of the first and second electron energy levels and the first and second hole energy levels.

25. A semiconductor structure according to claim 18, wherein the at least one quantum dot comprises at least a first quantum dot and a second quantum dot, the quantum dot layer further including material separating at least the first and second quantum dots, the first quantum dot having a first quantum dot bandgap, the second quantum dot having a second quantum dot bandgap, the material separating at least the first and second quantum dots having a dot separation material bandgap that is sufficiently larger than the first and second quantum dot bandgaps to substantially suppress tunneling of the electrons and holes between the first and second quantum dots.

* * * * *

UNITED STATES PATENT AND TRADEMARK OFFICE
CERTIFICATE OF CORRECTION

PATENT NO.   : 6,870,178 B2
DATED        : March 22, 2005
INVENTOR(S)  : Asryan et al.

It is certified that error appears in the above-identified patent and that said Letters Patent is hereby corrected as shown below:

Title page,
Item [57], ABSTRACT,
Line 12, "tunnelling" should read -- tunneling --.

Signed and Sealed this

Fifth Day of July, 2005

JON W. DUDAS
*Director of the United States Patent and Trademark Office*